(12) United States Patent
Tan (10) Patent No.: US 6,741,120 B1
(45) Date of Patent: May 25, 2004

(54) LOW POWER ACTIVE FILTER AND METHOD

(75) Inventor: Nianxiong Tan, Laguna Niguel, CA (US)

(73) Assignee: Globespanvirata, Inc., Red Bank, NJ (US)

( * ) Notice: Subject to any disclaimer, the term of this patent is extended or adjusted under 35 U.S.C. 154(b) by 0 days.

(21) Appl. No.: 10/213,483

(22) Filed: Aug. 6, 2002

Related U.S. Application Data (60) Provisional application No. 60/310,690, filed on Aug. 7, 2001, provisional application No. 60/310,668, filed on Aug. 7, 2001, provisional application No. 60/310,665, filed on Aug. 7, 2001, and provisional application No. 60/310,692, filed on Aug. 7, 2001.

(51) Int. Cl.[7] .................................................. H03B 1/00
(52) U.S. Cl. ....................................... 327/555; 327/554
(58) Field of Search ............................... 327/552, 553, 327/554, 555, 559

(56) References Cited

U.S. PATENT DOCUMENTS

| | | | | |
|---|---|---|---|---|
| 3,760,287 A | * | 9/1973 | Harris ............................. | 330/9 |
| 3,781,697 A | * | 12/1973 | Bruinshorst et al. .......... | 327/554 |
| 3,869,084 A | * | 3/1975 | Longman, Jr. ................ | 708/805 |
| 4,158,818 A | * | 6/1979 | Lerner .......................... | 327/557 |
| 4,988,952 A | * | 1/1991 | Sevastopoulos et al. ....... | 330/51 |
| 5,610,555 A | * | 3/1997 | Funahashi et al. ............. | 330/84 |
| 6,404,276 B1 | * | 6/2002 | Liu ............................... | 327/553 |
| 6,441,682 B1 | * | 8/2002 | Vinn et al. .................... | 327/552 |
| 6,452,443 B1 | * | 9/2002 | Thompson et al. ............ | 327/553 |
| 6,608,516 B1 | * | 8/2003 | Lennous ........................ | 327/344 |

* cited by examiner

Primary Examiner—Terry D. Cunningham
(74) Attorney, Agent, or Firm—Thomas, Kayden, Horstemeyer & Risley (57) ABSTRACT

Devices and method for effectively filtering a signal, particularly for a communication system, are disclosed. In this regard, an exemplary embodiment of the present invention may be construed as an AFE that includes a high-pass receive filter for a communication system. The filter includes an AC-coupled capacitive input and a plurality of RC integrators. At least one of the plurality of RC integrators includes a damping resistor in parallel with a feedback capacitor and a switch for enabling the damping resistor, such that when the damping resistor is enabled, the at least one RC integrator is damped so as to reduce DC instability.

15 Claims, 7 Drawing Sheets

LOW POWER ACTIVE FILTER AND METHOD

CROSS-REFERENCE TO RELATED APPLICATION

This application claims priority to the following co-pending U.S. provisional patents: a) U.S. Provisional Patent Application Serial No. 60/310,690 filed on Aug. 7, 2001, and entitled "Quad AFE for DSL CO Applications," b) U.S. Provisional Patent Application Serial No. 60/310,668, filed Aug. 7, 2001, and entitled "High-pass Receive Filter for VDSL," c) U.S. Provisional Patent Application Serial No. 60/310,665, filed on Aug. 7, 2001 and entitled "ADC Buffer for High-bandwidth ADCs," and d) U.S. Provisional Patent Application Serial No. 60/310,692, filed Aug. 7, 2001 and entitled "Automatic Tuning Technique for Analog Filters," which are all hereby incorporated by reference in their entirety.

This application is also related to the following co-pending U.S. utility patent applications: a) "Wide-Band Analog Front-End for DSL Applications," having Ser. No. (unknown), filed Aug. 6, 2002, with U.S. Express Mail Package No. EL924321582US; b) "A Buffer Circuit For A High-Bandwidth Analog To Digital Converter," having Ser. No. (unknown), filed Aug. 6, 2002, with U.S. Express Mail Package No. EL924321605US; and c) "System And Method For Tuning An RC Continuous-Time Filter," having Ser. No. (unknown), filed Aug. 6, 2002, with U.S. Express Mail Package No. EL924321596US; which are all incorporated by reference herein in their entirety.

FIELD OF THE INVENTION

The present invention generally relates to xDSL communications. More specifically, the invention relates to active filters for analog front ends (AFEs) of XDSL communication systems.

BACKGROUND OF THE INVENTION

With the advancement of technology, and the need for instantaneous information, the ability to transfer digital information from one location to another, such as from a central office to customer premises, has become increasingly important.

In a digital subscriber line (DSL) system, data is transmitted from a central office to customer premises via a transmission line, such as a two-wire pair, and is transmitted from the customer premise to the central office as well, either simultaneously or in different communication sessions. The same transmission line might be utilized for data transfer by both sites or the transmission to and from the central office might occur on two separate lines. In its most general configuration, a DSL card at a central office is comprised of a digital signal processor (DSP) which receives information from a data source and sends information to an AFE. The AFE serves as the interface between an analog line, such as the two-wire pair, and the DSP. The AFE functions to convert digital data, from the DSP, into a continuous-time analog signal when processing downstream data. Conversely, the AFE serves to convert an analog signal to digital data when processing upstream data.

As an important part of the aforementioned system responsible for proper transmission and reception of data in a broadband network, the AFE performs multiple functions in addition to converting a digital signal into a continuous-time analog signal, and vice versa. However, the functionality of the AFE is particular to the specific DSL application considered, wherein factors such as signal bandwidth, data rate, data reach, signal quality, power budget, and different applicable standards determine the optimum AFE.

In the receive path of the AFE, one fundamental component is a receive filter that may be configured to attenuate a strong echo signal so that the weaker receive signal may be later amplified without amplifying the noise produced by the echo. Unlike the transmit filter, the cut-off frequency of the receive filter is not extremely critical as the sole purpose of the receive filter is to attenuate the echo signal. What is critical however, is the attenuation in the stopband and the SNR in the passband. The specific configuration of the receive filter may vary with the particular application that will be utilized such as ADSL or VDSL.

Asymmetrical DSL (ADSL) is a popular service provided for residential customers, due to the asymmetrical nature of data usage, wherein more data flows towards the customer in the downstream direction, in comparison to the upstream data flow. The larger downstream data flow is generally attributed to accessing Internet Web sites. When a Web site is accessed, a relatively large amount of data related to the Web page is transmitted downstream to a browser located in a customer's PC. The bulk of the upstream data is generally attributable to e-mail traffic directed towards other Internet users, and this constitutes a smaller data volume than the one traveling downstream.

Very High bit-rate DSL (VDSL) is similar to ADSL but provides large amounts of bandwidth with speeds up to about 52 Mbps. In order to provide such high speeds, a large bandwidth, as mentioned, is required. Typically, the VDSL frequency band ranges from 25 or 138 kHz to up to about 12 MHz. Unfortunately, the trade-off with high frequencies is the distance the signals can travel along a copper line. The development of Fiber to the Curb (FTTC) and/or Fiber to the Neighborhood (FTTN) provides for the use of VDSL by, essentially, reducing the length of the copper loop. Fiber cables, which can support high bandwidths over long distances, are provided from the CO to Optical Network Units (ONUs) located either at the curb of residences or the gateway to a neighborhood. The ONUs can convert the optical signals into electrical signals downstream and vice-versa upstream. With the use of FTTN and or FTTC, the effective copper loop is reduced to below 4000 ft, which is the upper limit of VDSL. VDSL, for example, provides for the transmission of video signals over copper lines, which leads to applications such as digital television, Video-on-Demand, etc.

For VDSL applications at the CO, the receive filter must be high-pass to keep in line with the receive bandwidth. Based upon other considerations, such as ADC requirements, system requirements, etc., a $3^{rd}$ order elliptic high-pass filter may suffice for VDSL applications at the CO. This type of filter has been used before but can be improved.

One aspect that can always use improvement in filter design is the power in which the filter requires (provided an active filter) to perform the necessary operations. Minimizing power consumption is often desirable because it can reduce the operating cost of the communication services provider utilizing the equipment. Another aspect of filters, particularly receive filters in DSL communication systems, that can be improved is the level of attenuated noise. The more noise that is filtered out, typically, the better the filter. Noise, such as echo, is often detrimental to the ADC and the DSP of an xDSL communication system.

Therefore, there exists a continual need for improved active filters, particularly for receive filters for communication systems, that consume less power and can simultaneously provide better performance.

SUMMARY OF THE INVENTION

The present invention relates to improved filters and methods of filtering a signal for, in particular, communication systems. The filters in accordance with embodiments with the present invention can operate at a lower power level and perform better than presently known filters.

In this regard, a first embodiment of the present invention may be construed as an active filter that includes a summing amplifier having an input and an output, wherein the output of the summing amplifier provides the output of the filter. The filter also includes a first RC integrator having an input and an output and configured to emulate a first capacitance, wherein the output of the first RC integrator is coupled to the input of the summing amplifier, a second RC integrator having an input and an output and configured to emulate a second capacitance, and a third RC integrator having an input and an output and configured to emulate a third capacitance, wherein the output of the third RC integrator is coupled to the input of the summing amplifier. A fourth RC integrator is also included in the filter and has an input and an output and is configured to emulate an inductance. The input of the fourth RC integrator is coupled to the outputs of the first and second RC integrators and the output of the fourth RC integrator is coupled to the inputs of the first and second RC integrator. Finally, the filter also includes a selectable input stage having a first state and a second state. In the first state the input stage is configured to provide a DC-coupled non-capacitive input and in the second state the input stage is configured to provide an AC-coupled capacitive input.

In another embodiment, an AFE includes a high-pass receive filter for a communication system. The filter includes an AC-coupled capacitive input and a plurality of RC integrators. At least one of the plurality of RC integrators includes a damping resistor in parallel with a feedback capacitor and a switch for enabling the damping resistor, such that when the damping resistor is enabled, the at least one RC integrator is damped so as to reduce DC instability.

Yet another embodiment may be construed as a DSL interface card that includes an active high-pass filter located in an AFE of the DSL interface card. The filter includes a summing amplifier having an input and an output. The output of the summing amplifier provides the output of the filter. The filter also includes a first RC integrator having an input and an output and configured to emulate a first capacitance, wherein the output of the first RC integrator is coupled to the input of the summing amplifier, a second RC integrator having an input and an output and configured to emulate a second capacitance, and a third RC integrator having an input and an output and configured to emulate a third capacitance, wherein the output of the third RC integrator is coupled to the input of the summing amplifier. The filter also includes a fourth RC integrator having an input and an output and configured to emulate an inductance, wherein the input of the fourth RC integrator is coupled to the outputs of the first and second RC integrators and the output of the fourth RC integrator is coupled to the inputs of the first and second RC integrators. Finally, the filter also includes a capacitive AC-coupled input stage.

Another embodiment of the invention may be construed as an active high-pass filter that includes a summing amplifier having an input and an output. The output of the summing amplifier provides the output of the filter. The filter also includes an inductive RC integrator configured to emulate an inductor and a plurality of capacitive RC integrators configured to emulate capacitors of various capacitances. The plurality of capacitive RC integrators are selectively coupled to the summing amplifier and the inductive RC integrator so as to produce a desired transfer function. The damping coefficients of the plurality of capacitive RC integrators are selectively controlled to reduce DC instability in the filter.

Another embodiment of the present invention may be construed as an active high-pass filter for a communication system. The filter includes a selectable input stage having a first state and a second state. In the first state, the input stage is configured to provide a DC-coupled non-capacitive input and in the second state, the input stage is configured to provide an AC-coupled capacitive input. The filter also includes a plurality of RC integrators.

A representative method for effectively filtering a signal in accordance with embodiments of the present invention includes: providing an active filter configured with a first RC integrator, wherein the first RC integrator comprises a damping resistor for reducing the DC gain of the first RC integrator; and controlling the damping resistor, such that the damping resistor is either enabled or disabled.

Other systems, methods, features, and/or advantages of the present invention will become more apparent to one with skill in the art upon examination of the following drawings and detailed description. It is intended that all such additional systems, methods, features, and/or advantages be included within this description, be within the scope of the present invention, and be protected by the accompanying claims.

BRIEF DESCRIPTION OF THE DRAWINGS

The present invention will be more fully understood from the detailed description given below and from the accompanying drawings of the preferred embodiment of the invention, which however, should not be taken to limit the invention to the specific embodiments enumerated, but are for explanation and for better understanding only. Furthermore, the drawings are not necessarily to scale, emphasis instead being placed upon clearly illustrating the principles of the invention. Finally, like reference numerals in the figures designate corresponding parts throughout the several drawings.

DETAILED DESCRIPTION

Figure 1:
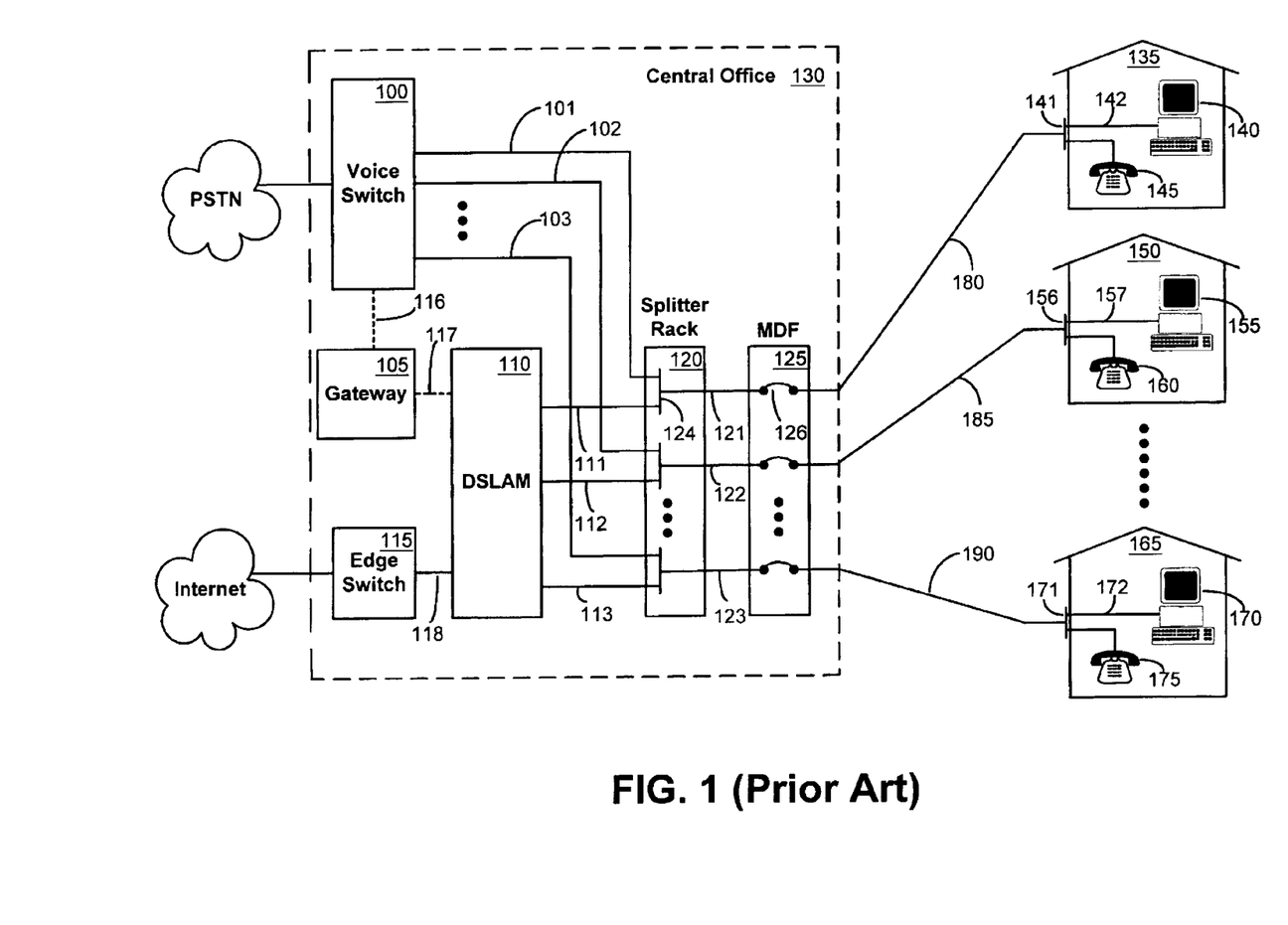
FIG. 1 is an illustration of a typical central office providing full-rate xDSL service to multiple residential customers.

Turning now to the drawings illustrating the present invention, wherein like reference numerals designate corresponding parts throughout the drawings, FIG. 1 is an illustration of certain components in a typical central office 130 providing fill-rate xDSL service to multiple residential customers.

To define some commonly-used terms in telecommunication applications, data flowing in the general direction from residences 135, 150, 165 towards the central office (CO) 130 is typically referred to as "upstream" data, while data flowing in the opposite direction, from CO 130 towards residences 135, 150, 165, is termed "downstream" data. Also, the communication links that exist between one CO 130 and another in the public switched telephone network (PSTN), are generally referred to as "trunks," while'the communication links between the CO 130 and residences 135, 150, 165 are referred to as "lines" 180, 185, and 190.

While the explanation in this disclosure may often refer to only one direction of data flow for ease of explanation, it will be understood that the data flow within the various elements shown in FIG. 1, is generally bi-directional in nature, and the circuits and methods explained in this disclosure may be implemented in either direction.

The DSL access multiplexer (DSLAM) 110, shown located inside the CO 130, is a major component of any system that is designed to provide DSL service, such as Asymmetric DSL (ADSL) or VDSL to multiple customers from a centralized location. On the trunk side of the DSLAM, a high speed data link 118 is shown connecting it to an edge switch 115. Data link 118 may, for example, carry data packets contained inside an asynchronous transfer mode (ATM) transport mechanism, or Ethernet package. These data packets are suitably routed by the edge switch 115, and are transported from and into the Internet, as shown in FIG. 1.

An alternative trunk side high-speed data link 117, shown as a dotted connection in FIG. 1, may be provided in certain applications, wherein the DSLAM 110 transmits data packets contained within a suitable transport mechanism, such as an OC-3 link, into the gateway 105. The gateway translates the packet format into a time division multiplex (TDM) format, which can be processed by the voice switch 100 before transmission into the PSTN.

On the line side of DSLAM 110, communication links 111, 112 and 113 are three of "n" communication links that connect the DSLAM 110 into the splitter rack 120. While FIG. 1 depicts the splitter rack 120 as existing external to DSLAM 110, several system configurations physically incorporate the splitter functionality within the DSLAM 110. The links 111, 112 and 113 carry the downstream and upstream DSL data.

Communication links 101, 102 and 103 are three of "n" communication links that connect the voice switch 100 to the splitter rack 120. Links 101, 102 and 103 carry analog voice frequency signals bi-directionally. Splitter 124 is one of several splitters contained in the splitter rack 120.

Splitter 124, used here for explanation purposes in a full-rate ADSL or VDSL application, combines the downstream DSL signal that is transmitted by the DSLAM 110 via link 111, with the analog voice frequency (VF) signal carried from voice switch 100 over link 101, before transmitting it to the main distribution frame (MDF) 125, via link 121. Splitter 124 is so named, because it "splits" the DSL signal from the analog VF signal, in the opposite (upstream) direction.

The MDF 125 is a centralized CO wiring interface, where all the wires entering and exiting a CO are interconnected. For example, link 121, which may consist of an unshielded twisted pair (UTP) of wires used inside the CO building, is interconnected by jumper 126, to the external two-wire pair line 180 which is generally designed to be enclosed inside a shielded cable assembly.

The downstream DSL signal together with the downstream analog VF signal that is present at jumper 126 is connected by line 180, which is generally a residential POTS line, to the residence 135. Splitter 141 is located on the outside wall of residence 135, and splits the signal transmitted from the interconnection 126, into an analog VF signal and a downstream DSL signal.

The analog VF signal may be routed to a telephone 145, as shown in FIG. 1, while the downstream DSL signal is connected to a PC 140, via communication link 142. The DSL signal entering PC 140 is generally routed to an DSL modem that may be installed inside the PC 140 or may be installed as an external modem that is cabled into the PC 140.

Figure 2:
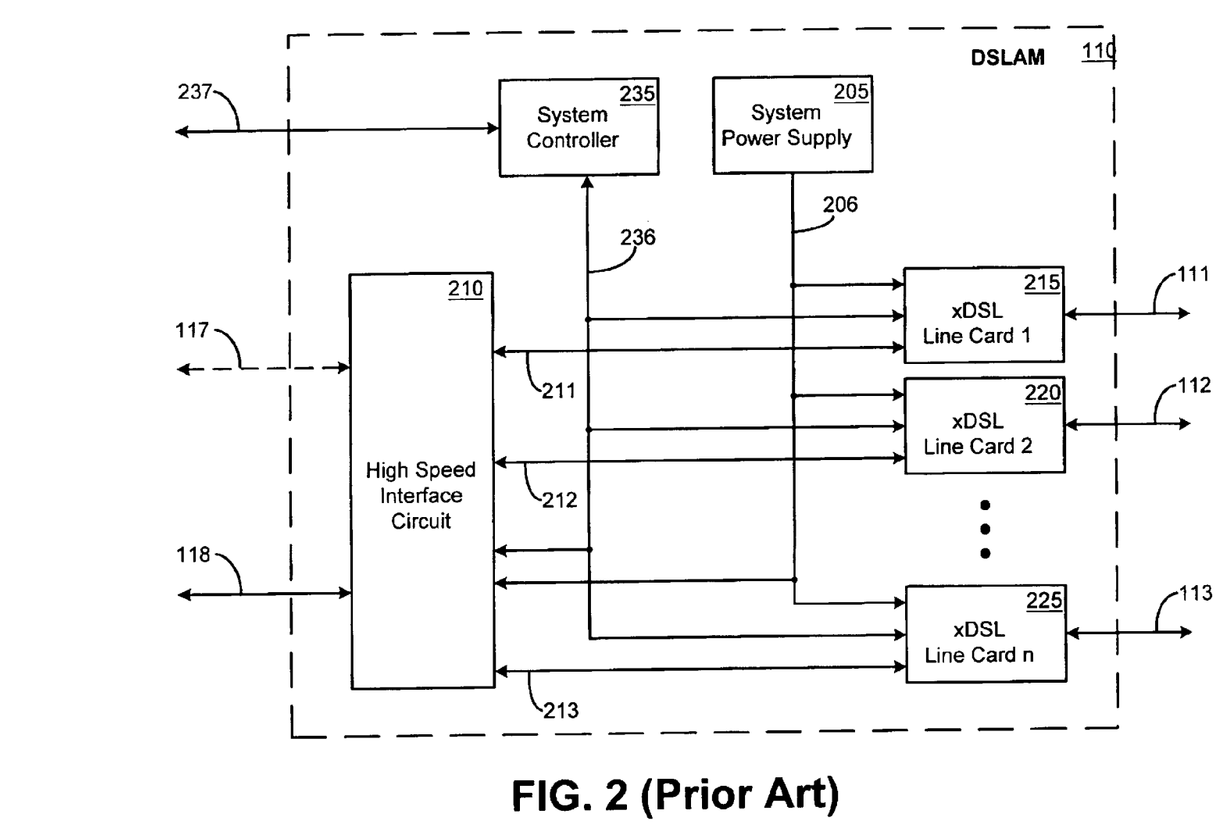
FIG. 2 is a block diagram representation of the main functional blocks inside a typical DSLAM.

FIG. 2 is a block diagram representation of the main functional blocks inside a typical DSLAM 110. The various blocks shown in FIG. 2, generally represent circuit packs that are plugged into a DSLAM chassis. The circuit pack architecture permits easy insertion and/or removal, thereby permitting a certain degree of flexibility in configuring the DSLAM 110 to provide various types of DSL service. It also allows relatively easy replacement of defective circuit packs, a replacement that may be carried out while the DSLAM 110 is in operation without generally affecting the multiple customers that are being provided DSL service.

The high-speed data link 118, as well as the optional high speed data link 117, which were referred to earlier in FIG. 1, are the trunk-side connections of the high-speed interface circuit 210. Data link 118, may carry data packets over various transport protocols, such as ATM and TCP/IP. On the line side of the interface circuit 210, low-speed data links such as links 211, 212 and 213 connect the high-speed interface circuit 210 to multiple line cards. The line cards shown in FIG. 2 may be composed of several different types of cards to cater to a mix of xDSL services, such as the previously discussed ADSL, as well as Symmertic DSL (SDSL), High bit-rate DSL (HDSL), Single-pair HDSL (SHDSL), Very High bit-rate DSL (VDSL), etc.

Business users may prefer a more symmetric data flow that ADSL, and SDSL may be more suitable for such purposes. Correspondingly, a typical DSLAM may include a number of ADSL line cards together with SDSL, HDSL, and/or VDSL line cards.

FIG. 2 depicts "n" number of xDSL line cards serving a number of residential customers. xDSL line card 1 215 provides xDSL service to residential customer 135, while xDSL line card 2 220 provides xDSL service to residential customer 150, and xDSL line card n 225 provides xDSL service to residential customer 165.

System controller 235 is used for operations, administration, maintenance, and provisioning (OAM&P) purposes. Provisioning the DSLAM 110 may include such procedures as would be necessary to provide various different types of DSL service via different types of line cards. Maintenance may include inventory procedures as well as defect reporting. System controller 235 generally communicates to elements that are external to DSLAM 110, via a communication interface that is not shown in FIG. 2.

System power supply 205 provides power, typically in the form of several DC voltages that may be required to operate the circuit packs in the DSLAM 110. These voltages may include for example, +3.3 volts to operate the various digital ICs, and +/−15 volts to operate the line interfaces. System power supply 205 is typically powered by an external power source, such as a 48 volt battery bank, via a power-line connection that is not illustrated in FIG. 2.

Figure 3:
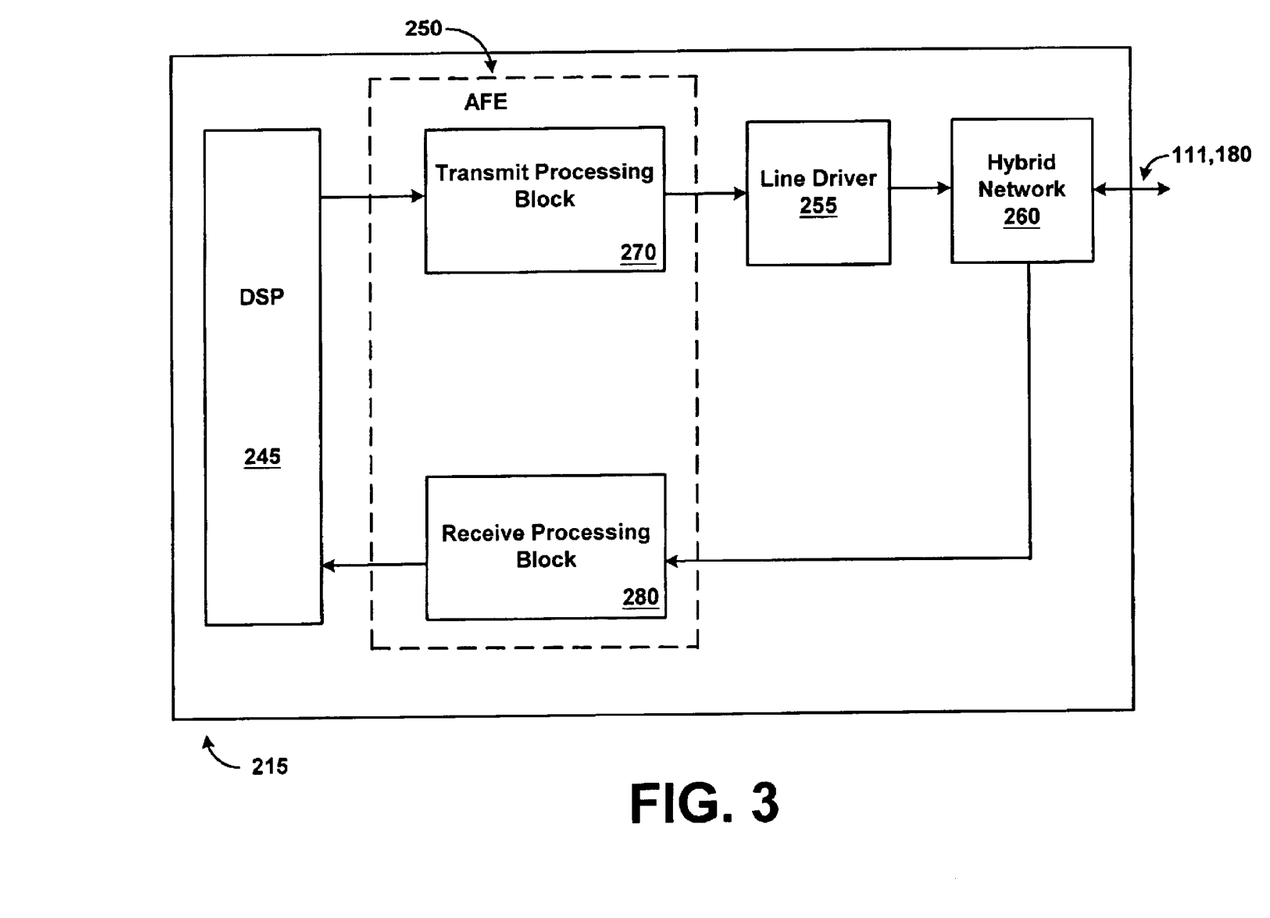
FIG. 3 is a block diagram further illustrating the xDSL central office interface card of FIG. 2.

FIG. 3 is a block diagram further illustrating the CO xDSL interface card 215 of FIG. 2. As shown by FIG. 3, with regard to the present illustration, transmission of data may be directed from the CP 135 to the CO 130, from the CO 130 to the CP 135, or in both directions at the same time via line 180. The xDSL interface card 215 located at the CO 130 may comprise a CO digital signal processor (DSP) 245, which receives information from a data source (not shown) and sends information to a CO AFE 250. The CO AFE 250 may interface between the local loop 180, via link 111, and the CO DSP 245 and functions to convert digital data, from the CO DSP 245, into a continuous time analog signal.

The analog signal is delivered, via a CO line driver 255, in accordance with the amount of power required to drive the amplified analog signal through a hybrid network 260, the line 180, and then on to the CP 135. An xDSL interface card similar to interface card 215 may be found at the CP 135 and perform the reciprocal operations as the xDSL interface card 215.

In the receive path, an upstream analog signal may be received by hybrid network 260. The hybrid network 260 may then de-couple the received signal from the transmitted signal, by subtracting the transmitted signal from the sum of the transmitted and received signals. The AFE 250 may then convert the received analog signal into a digital signal, which may then be transmitted to the DSP 245 for further digital processing.

The AFE 250 generally serves to convert a digital signal to analog in the transmit path and convert an analog signal to digital in the receive path. For simplicity, the transmit path of the AFE 250 shall be termed a transmit processing block 270. In general terms, the transmit processing block 270 may include DAC (not shown), which performs the conversion. Several filter stages and/or gain stages may also be included within the transmit processing block 270 to attenuate out-of-band noise and/or amplify the in-band signal. Typically, noise may be produced in the transmit signal from processing by the DSP 245 as well as the DAC. In some AFEs, digital filters may be included with the AFE 250 to filter the digital transmit signal prior to conversion. The transmit processing block 270 may include several stages and/or several different implementations depending upon the attenuation requirements, power requirements, etc. Likewise, the transmit processing block 270 may be configured in such a way for a specific DSL application. For example, for ADSL applications, the transmit (downstream) frequency band is typically between 138 kHz to 1.1 MHz, which may call for a high-pass filter with a cut-off frequency around 138 kHz. In SDSL applications, the downstream frequency band is typically around 567 kHz to 1.1 MHz, which may call for a high-pass filter with a different cut-off frequency. For HDSL or SHDSL applications, no filter may be utilized due to the overlapping of the transmit and receive bandwidth. Other applications, such as VDSL may utilize different types of analog filters or may configure similar filters differently for different applications. Once the transmit signal is filtered, it may be provided to the line driver 255 for further processing towards transmission.

In the receive path, the AFE 250 may perform similar functions. The received analog signal may be processed by several analog filters and/or gain stages. The receive processing block 280 may be configured to attenuate out-of-band noise, whereas several gain stages may be configured to amplify the in-band signal. Once filtered, the analog signal may be provided to an ADC for conversion to digital. The digital receive signal may be further processed by digital filters (not shown) if applicable. The digital signal may be passed along to the DSP 245 for further processing. The receive processing block 280 will be discussed in more detail in subsequent figures.

Figure 4:
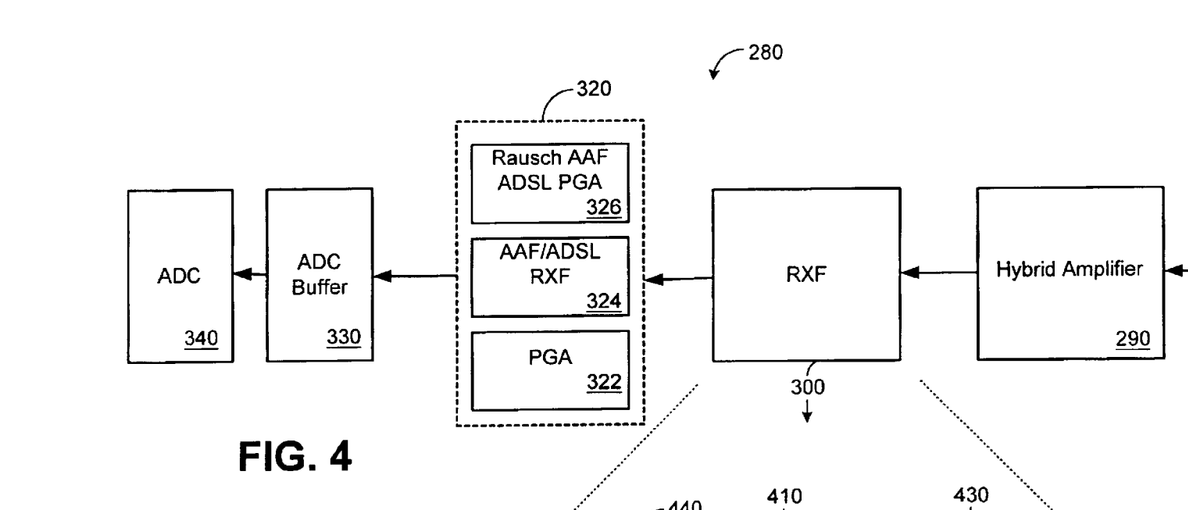
FIG. 4 is a block diagram illustrating the receive path of an AFE in accordance with embodiments of the present invention.

FIG. 4 is a block diagram illustrating the receive processing block 280 of the AFE 250 of FIG. 3. A hybrid amplifier 290, the high-pass receive filter (RXF) 300, PGA 322, AAF/ADSL RXF 324, Rausch AAF ADSL PGA 326, ADC buffer 330, and ADC 340 are elements that may be included in the receive processing block 280 inside AFE 250. An analog signal that is received via circuitry connected to a DSL line, is fed into the hybrid amplifier 290 and appears as a digital signal at the output of ADC 340 after having traversed a receive signal path. The digital signal may then be provided to the DSP 245, which is external to the AFE 250.

The hybrid amplifier 290 may be a first-stage programmable gain amplifier with a wideband frequency response that is independent of the gain setting. It has a typical operating voltage gain range of −6 dB to +24 dB. Its input impedance is selectable between 50 ohms and 600 ohms thereby allowing it to be interfaced into external circuitry of correspondingly matched output impedance. The input signals to the hybrid amplifier may be derived from one of three different sources—an external hybrid circuit, an external receiver circuit, or an internal test multiplexer circuit contained inside AFE 250.

The VDSL RXF 300 may be a high-pass filter and is typically a third-order elliptic filter that is used to eliminate unwanted echo signals. Removing these unwanted signals is desirable in minimizing the design specification requirements of ADC 340, and relaxing the accuracy requirement of the analog-to-digital conversion. Typical cut-off frequencies are 3, 3.75, and 4 MHz. The RXF 300 may be programmably by-passed if it is not needed for a particular application. It should be noted, that although VDSL is the preferred application in which the RXF 300 may be utilized, may other applications can utilize the RXF 300, namely other xDSL applications, other communication applications, and furthermore, other analog signal processing applications. The RXF 300 will be discussed further in subsequent figures.

A programmable gain amplifier (PGA) 322 may provide programmable gain up to 23 dB, with a typical step resolution of 1 dB. The input signals to PGA 322 may be derived from one of three different sources—the hybrid amplifier 290, the RXF 300, or another passive filter (not shown), that may located outside AFE 250. AAF/ADSL RXF 324 is a dual-purpose filter that can be either used as an anti-aliasing filter, or as a receive signal filter for ADSL. When used as an anti-aliasing filter, AAF/ADSL RXF 324 prevents noise-aliasing at the input stage of the ADC 340. Typically, a third-order elliptic filter with variable cut-off frequency, e.g. 5.2 MHz, is used to implement this circuit. This filtering is desirable as the ADC 340 uses a Nyquist approach rather than an over-sampling technique.

When used as a receive signal filter in an ADSL application, AAF/ADSL RXF 324 has a selectable cut-off frequency of either 138 kHz or 276 kHz. AAF ADSL RXF 324 may be selectively by-passed when not needed for a particular application.

Rausch AAF ADSL PGA 326 incorporates a filter circuit that can be used as an anti-aliasing filter for VDSL signals. Rausch AAF ADSL PGA 326 can also be used to provide programmable gain to a signal that has been transmitted through AAF ADSL RX 326 configured as a receive filter circuit. The filter cut-off frequency may be set at a typical value of 5.2 MHz for VDSL, and at either of two frequencies, 138 kHz or 276 kHz, for ADSL signals. The gain can be programmed up to 10 dB in steps of 1.5 dB. Rausch AAF ADSL PGA 326 may be selectively by-passed where not required.

ADC buffer 330 is a wide-band buffer circuit that drives ADC 340. It may be selected to accept one of three signals from three different sources—PGA 322, AAF/ADSL RXF 324, or Rausch AAF ADSL PGA 326. It is programmable for different bandwidths depending on specific applications.

ADC 340 is a pipeline analog-to-digital switched-capacitance converter with a maximum resolution of 14 bits. Typically, only 12-bit resolution is used in several DSL applications. ADC 340 accommodates wide-band signal inputs such as VDSL, and avoids the use of over-sampling techniques that require high clock rates with their attendant issues of implementation and operation such as cross-talk and electro-magnetic interference (EMI).

Figure 5:
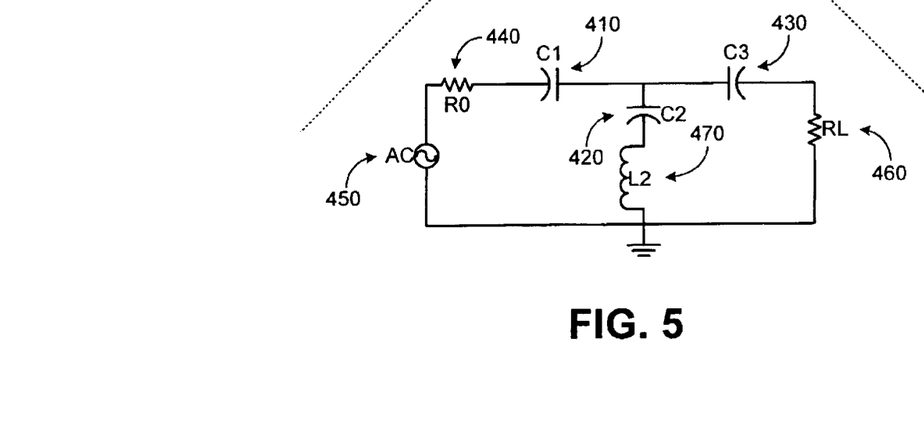
FIG. 5 is a circuit schematic illustrating a passive-element prototype of a receive filter in accordance with the present invention.
Figure 6A:
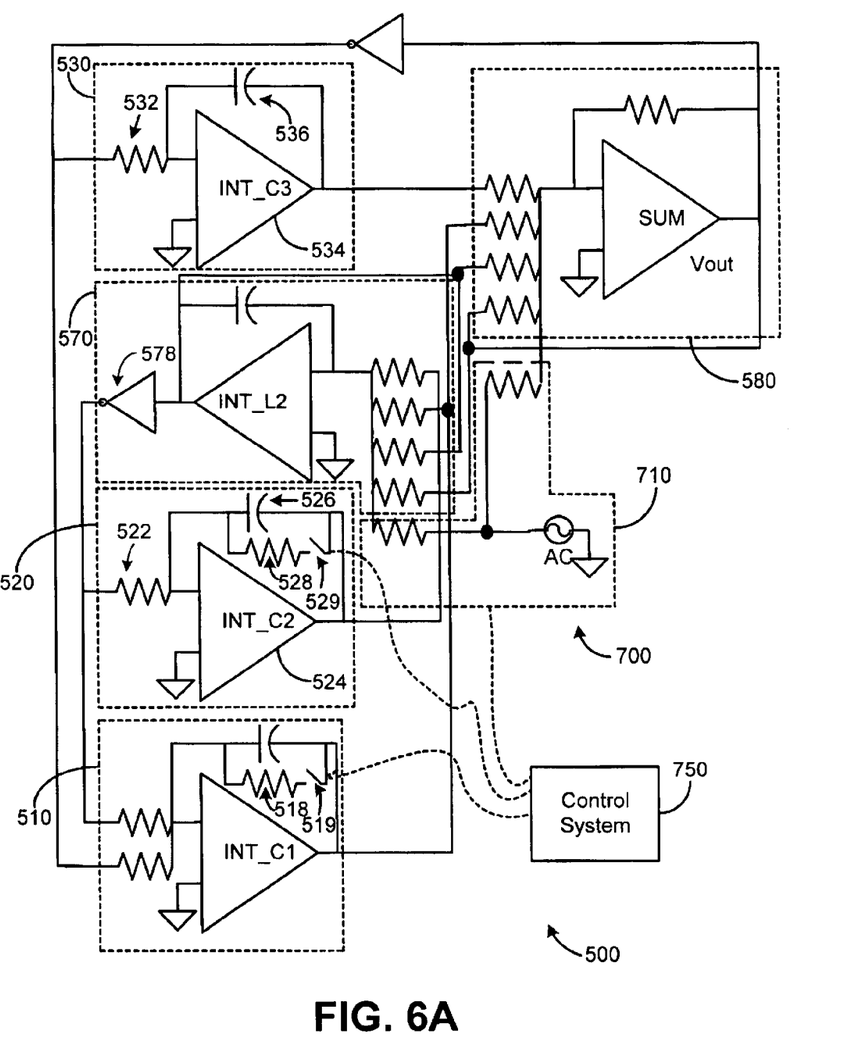
FIG. 6A is a detailed circuit schematic illustrating a first active-element implementation of the receive filter of FIG. 5.
Figure 6B:
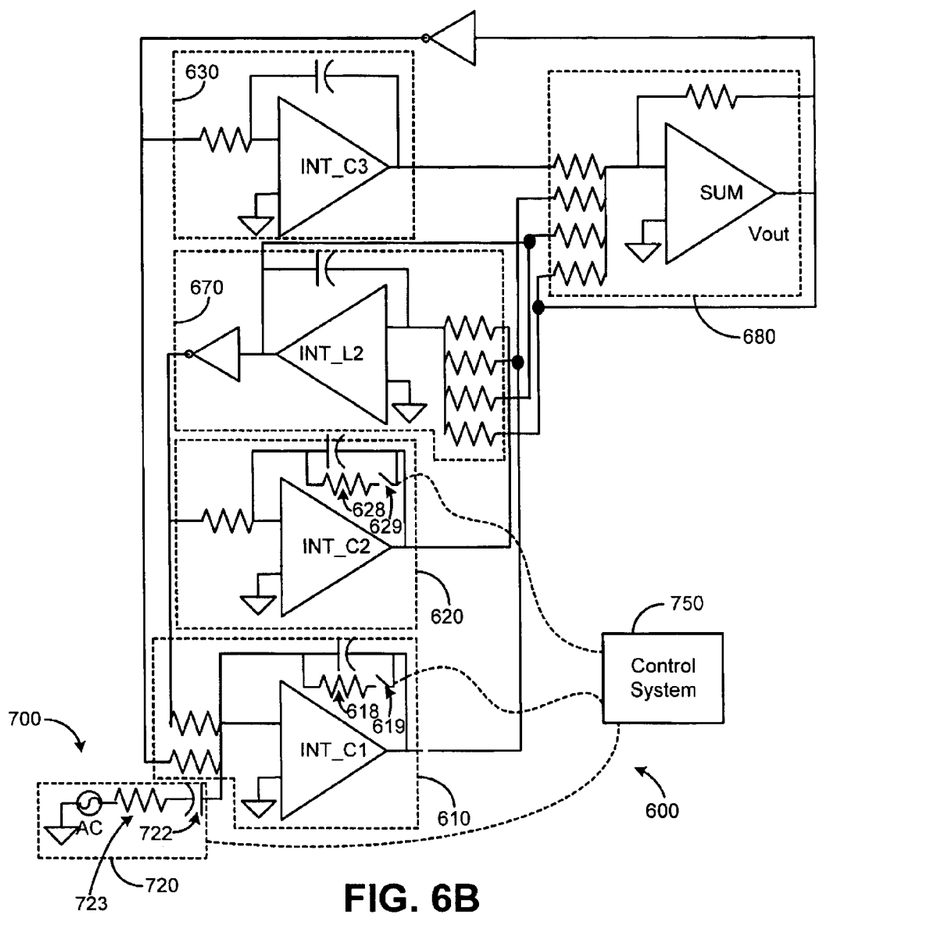
FIG. 6B is a detailed circuit schematic illustrating a second active-element implementation of the receive filter of FIG. 5.

Having briefly described the general components of the receive processing block 280 of the AFE 250, attention is now directed toward FIG. 5 which illustrates a circuit schematic of a passive-element prototype of RXF 300 in accordance with embodiments of the present invention. It should be noted the circuit schematic of FIG. 5 is not necessarily novel but is used as description purposes to better define the RXF 300 as it attempts to only show a passive prototype of the RXF 300. FIGS. 6A and 6B will show embodiments of the present invention which are active implementations of the RXF 300.

RXF 300 is a $3^{rd}$ order high-pass elliptic filter. An elliptic filter (also known as a Cauer response) provides the steepest out-of-band attenuation of any filter response. This is generally achieved by adding resonance, or notch sections, to the filter. This is advantageous for the purposes at hand, namely for a high-pass filter in the receive path of the AFE 250. In general, the circuit schematic of the filter 300 can be seen as a two-port circuit, the input being an AC input 450 and the output being across the resistive load 460. An input resistance, $R_o$, 440 is coupled to the AC input 450 into a first capacitance $C_1$ 410 in series. A first inductance $L_2$ 470 is coupled with a second capacitance 420 in series, which is in parallel with the AC input 450, the input resistance 440, and capacitor $C_1$ 410. The output resistive load 460 is in series with capacitor $C_3$ 430 which provides a third parallel branch to the circuit.

Embodiments of the present invention will provide improvements over an active filter representation of this passive prototype discussed here in FIG. 5. Of note in the prototype are the three capacitances which, are coupled together at a single node. According to Kirchoff's current law, the sum of the currents flowing through each of the three capacitors must equal zero at the common node. Unfortunately, in an active representation where opamps are used to emulate the capacitors, the currents do not add up to zero due to the DC offsets passing through the op amps, which can cause DC instability. In general, DC instability degrades performance of the filter and serves as an area that can be improved.

FIG. 6A is a detailed circuit 500 illustrating a first active-element implementation of the passive-element prototype receive filter of FIG. 5. The circuit 500 of FIG. 6A as well as the circuit 600 of FIG. 6B may be derived by using the signal-flow representation of the passive filter prototype of FIG. 5. The signal-flow methodology is a well known technique. Active elements are quite often used for on-chip implementations of circuits because they can typically be manufactured on a much smaller scale than passive components and so can be more compactly placed. This is quite advantageous for chip manufacturing. Also, active components help maintain low sensitivity to variations which may arise during manufacturing and/or during operation of the filter.

As mentioned, the circuit 500 is a first implementation of the active high-pass filter and serves to provide for a first state of a selectable input stage 700. The circuit 600 to be discussed in FIG. 6B is a second implementation of the active high-pass filter and serves to provide for a second state of the selectable input stage 700. The selectable input stage will be discussed further shortly.

The circuit 500 includes several RC integrators, which serve to emulate corresponding passive components in the prototype of the RXF 300. A first RC integrator, INT_C1, 510 is configured to emulate capacitor $C_1$ 410 of the prototype filter in FIG. 5. A second RC integrator, INT_C2, 520 is configured to emulate capacitor $C_2$ 420 and a third RC integrator, INT_C3, 530 is configured to emulate capacitor $C_3$ 430. A fourth RC integrator, INT_L2, 570 is configured to emulate inductor $L_2$ 470. A summing amplifier 580 is also included in the filter circuit 500.

The output of the first, second, and third integrators 510, 520, and 530 are all coupled to the input of the summing amplifier 580. The output of the first and second integrators 510 and 520 are coupled to the input of the inductive integrator 570. The output of the inductive integrator 570 is coupled to the inputs of the first and second integrators 510 and 520. The output of the filter circuit 500 is provided at the output of the summing amplifier 580. A non-capacitive DC-coupled input 710 is provided at the input of the inductive integrator 570 and the summing amplifier 580. In prior art active filters similar to this embodiment, two summing amplifiers were utilized to produce essentially the same transfer function. In this embodiment, as well as that discussed in FIG. 6B, only one summing amplifier is needed. This helps to reduce the power in which the filter consumes. This is one advantage to the embodiments of the present invention.

RC integrator 530 is indicative of a standard RC integrator circuit in that it includes an operational amplifier (op amp) 534, an input resistance 532 coupled to one of the inputs of the op amp 534 and a feedback capacitance 536 coupled to the input resistance 532 and the output of the RC integrator 530. The other input to the op amp 534 is typically AC grounded.

RC integrator 570 is configured to emulate an inductor such as inductor $L_2$ 470 of FIG. 5. RC integrator 570 is similar to RC integrator 530 in that it includes an op amp, a feedback capacitor, and an input resistance into one of the op amps inputs. The input resistance is essentially the parallel combination of several input resistances, each configured as scaling factors for a distinct input. RC integrator 570 also includes an inverting element 578 (shown here as a simple inverter) which serves to invert the output of the integrator circuit, thus realizing the inductive transfer function. In practice, an inverting amplifier with a gain of—1 may be used as the inverter 578. In a single-end realization of this circuit, an extra op amp may be necessary to perform the inverting. In a fully differential implementation of this circuit, the negative output of the differential amplifier can be taken and so an extra op amp can be avoided. It should be noted that both implementations can be realized and essentially can be implemented to perform the same general function.

RC integrator 510 and RC integrator 520 are similar to RC integrator 530 in that they are standard RC integrator circuits. However, RC integrators 510 and 520 may also be configured with a resistor 518 and 528 coupled in parallel to the feedback capacitor of each integrator. The resistor 518 and 528 may be switched in or out to control the damping effect the integrators 510 and 520 have on the circuit. Damping any one of the integrators 510 or 520 can help in avoiding DC instability that may result due to the DC offset generated in the op amps of the integrators. As briefly discussed in FIG. 5, in the passive circuit, the three capacitors are coupled together at a single high-impedance node. According to Kirchoff's current law, the sum of the currents at this node (the currents passing through the three capacitors) must equal zero. In the active implementation of this, i.e. filter circuits 500 and 600, this causes problems because of the DC offsets in the op amps. The sum of the currents do not necessarily equal zero, and so DC instability ensues. Damping at least one of the integrators 510 or 520 helps in minimizing DC instability by reducing the DC gain across the op amp of the particular integrator. This helps in reducing the amplified DC offset of that particular integrator. Another significant disadvantage of damping integrator INT_C2 520 is that it also reduces the quality factor of a resonator which is formed by the integrator 520 with the integrator INT_L2 570. Reducing the quality factor reduces the notch depth in the pass-band portion of the frequency response as well as extends the transition band (the band between pass-band and stop-band). However, damping INT_C1 610 does not have this disadvantage.

Switches 519 and 529 (for integrators 510 and 520, respectively) may be utilized to switch in and out the parallel resistance 518 and 528. The switches 519 and 529 may be transistor-based switches or other complimentary switching means.

The input stage of the filter circuit 500, as mentioned, is a non-capacitive DC-coupled input. Therefore, any DC signals are also provided to the filter circuit 500 and undergo any DC amplification the circuit 500 may produce. The DC signals typically are unwanted as they are usually seen as offset to the system. Amplifying the DC signals reduces the voltage headroom for wanted signals which, generally, reduces the SNR of the RXF filter 300. Noise seen at the output, particularly in the pass-band may be amplified further by the PGA 322, or other similar amplifying block, prior to the ADC 340. This further amplified DC offset can be problematic when quantized by the ADC 340 (See FIG. 4). For example, during a handshaking phase of the DSL interface card, the received signal is very weak. The amplified DC offset could mask the handshaking signal, causing the link not to be able to be established.

The filter circuit 600 of FIG. 6B is a second active-element implementation of the receive filter 300 of FIG. 5. The filter circuit 600 is similar to the filter circuit 500 of FIG. 6A except that a capacitive AC-coupled input stage 720 is included in the circuit. A capacitor 722 is in series with the input to block any DC signal. This helps reduce the potential for a DC level noise signal to be amplified by the filter circuit 600, which can greatly improve the performance of the filter 300. The capacitive AC-coupled input 720 is coupled to the input of a first integrator 620 (INT_C1) of the filter circuit 600. The location of the input stage is different from that of filter circuit 500 because a capacitive input at the input location of circuit 500 would cause several problems. The input of the INT_L2 integrator 570 would see a capacitive input which would form a gain stage of the integrator 570. Furthermore, a capacitive input to the summing amplifier 580 would cause the summing amplifier 580 to become a differentiator. This would cause unwanted results and change the transfer function of the circuit 500. Placing the capacitive input 720 at the input of integrator 610 of filter circuit 600 produces the same transfer function as placing a non-capacitive input 710 at the chosen location of filter circuit 500. The filter circuit 600, however, has reduced DC signals and so a reduced noise floor. Preliminary testing has shown a reduction in the in-band noise of 6 dB. The primary reason for reduced noise, however, is fewer resistors. The way to effectively reduce noise is to reduce the resistance values. When we reduce the resistance values by a factor of two, the noise only decreases by 3 dB. These resistances also burn much power. In the filter circuit 500 and 600, the noise can be reduced by using fewer resistors as compared to prior art solutions. This also requires less operating power.

However, the AC-coupled input 720 can create trouble for the driving circuit, i.e., the hybrid amplifier 290 (See FIG. 4). A large capacitive loading on any circuit using Miller-compensated op amps can cause instability due to the excess phase shift. To avoid this, a series resistance 723 is added such that the driving circuit will not see the capacitive load. The value of the resistance 723 is chosen such that the pole frequency created by the resistance and capacitance is high enough to guarantee that the attenuation at the higher frequency of the band of interest (e.g., 5.2 MHz) is minimal.

The filter circuit 600 is identical to the filter circuit 500, other than the input stage 700. The integrators 610 and 620 include damping resistors 618 and 628 as well as switches 619 and 629 to variably control the damping effect of the integrators 610 and 620.

Another aspect of both filter circuits 500 and 600 is that the response of the filter 300 may be programmably adjusted for variations in the particular application as well as tuned for variations in the individual components during manufacture as well as due to the effect of temperature on the circuit. The resistances and capacitances of the integrators of the circuits 500 and 600 may be varied in accordance with a particular desired response. For example, for VDSL applications, the frequency response is different than for ADSL applications. This general concept is discussed in U.S. Pat. No. 6,281,829 to Amrany et al., which is incorporated herein by reference. Furthermore, the filter circuits 500 and 600 can be tuned with an automatic process that accounts for component variations. This process can also account for changes in the actual components caused by temperature drift. Co-pending "System And Method For Tuning An RC Continuous-Time Filter" filed concurrently herewith via Express Mail No. EL924321596US, discloses this and is included by reference in its entirety herein.

A control system 750 may be configured to control the switches 519, 529, 619, and 629 to control the damping effects on the respective integrators 510, 520, 610 and 620 to reduce DC instability as discussed above. Furthermore, the control system 750 may be configured to switch the selectable input stage 700 to either the non-capacitive DC-coupled input 710 (a first state) or the capacitive AC-coupled input 720 (a second state). The control system 750 may be configured within the AFE 250 with simple digital switching. A one-bit control may be utilized for each switch 519, 529, 619, and 629 as well as another to switch the state of the input stage 700. The control signals may be provided to the AFE 250 by the DSP 245 (See FIG. 3). Other comparable switching mechanisms may be utilized as well. Switching mechanisms of embodiments of the present invention should not be limited to those which have been disclosed herein.

Figure 7:
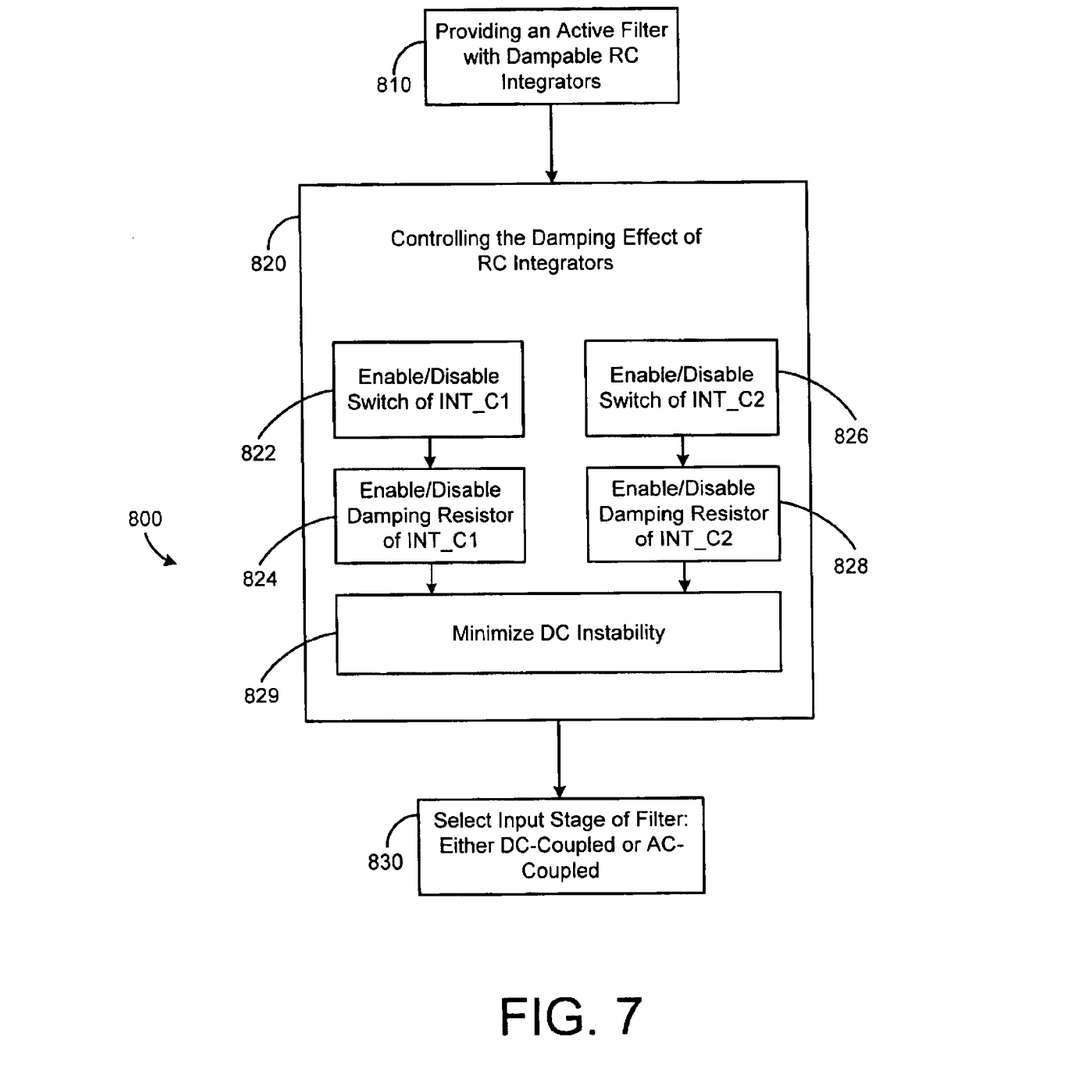
FIG. 7 is a flow chart illustrating a method for effectively filtering a signal in accordance with embodiments of the present invention.

FIG. 7 is a flow chart illustrating a method 800 for effectively filtering a signal in accordance with embodiments of the present invention. The method 800 begins at step 810 by providing an active filter that comprises dampable RC integrators. Generally, the method 800 may be implemented by using one of the active filter circuits 500 and 600 previously described in FIGS. 6A and 6B, respectively. It should also be noted that other active filters could utilize this same general method 800 to effectively filter a signal. For example, a transmit active filter such as one found in the transmit processing block 270 of the AFE 250 (Aee FIG. 3), or in general, any active filter, could utilize this method 800. The method 800 continues with step 820 by controlling the damping effect of the RC integrators. Generally, the step of controlling the damping effect of the RC integrators is comprised of enabling and disabling switches found in the RC integrators, for example, INT_C1 (510 and 610) and INT_C2 (520 and 620) of filter circuits 500 and 600 (steps 822 and 826). Enabling or disabling the switches of INT_C1 and INT_C2 provide for the enablement and disablement of the damping resistors of these respective integrator circuits (steps 824 and 828). Enabling the damping resistor of the respective integrators provides for a feedback resistance which helps reduce the DC gain through the opamps of the integrators. Reducing the DC gain helps in reducing amplification of any DC offset that is to be passed through the opamps of the integrators, thus effectively reducing or minimizing any DC instability in the filter. Reducing DC instability in the filter maximizes the performance of the active filter. For example, in preliminary testing, without any damping resistors in place, a DC offset was found to be amplified by more than 70 dB, thus saturating the opamps. When damping one of the RC integrators with a damping resistor, assuming a 10 mV input-referred offset, it was found that any one damped RC integrator will only create a 0.18 V offset at its opamp output rather than a 42 volt offset at the opamp output without damping. By damping both of the RC integrators, it was found that the DC gain is further reduced by approximately 6 dB thus helping minimize DC instability. Another side effect of the damping integrator INT_C2 of filter circuit 500 or 600 was found to also reduce the quality factor of the resonator formed by INT_C2 and INT_L2 as discussed in relation to FIG. 6A. Reducing the quality factor reduces the notch depth in the pass-band and also makes the transition band wider. By damping INT_C1, the quality factor will not be impacted.

The method 800 continues with step 830 where a selectable input stage of the filter can be chosen. In a first state, the input stage is a DC-coupled non-capacitive input, and in the second state, it is an AC-coupled capacitive input. In the AC-coupled capacitive input, any DC offset introduced at the input of the filter, can be reduced by the capacitive input thus reducing the noise at the DC level which would be amplified by the filter and thus amplified later by any gain stages downstream.

It should be emphasized that the above-described embodiments of the present invention, particularly, any "preferred" embodiments, are merely possible examples of implementations set forth for a clear understanding of the principles of the invention. Many variations and modifications may be made to the above-described embodiment(s) of the invention, for example, the system and method in which the switching between input stages and the control of the damping resistors is performed, without departing substantially from the spirit and principles of the invention. All such modifications and variations are intended to be included herein within the scope of the present invention and protected by the following claims.

What is claimed is:

1. An active filter comprising:
   a summing amplifier having an input and an output, wherein the output of the summing amplifier provides the output of the filter;
   a first RC integrator having an input and an output and configured to emulate a first capacitance, wherein the output of the first RC integrator is coupled to the input of the summing amplifier;
   a second RC integrator having an input and an output and configured to emulate a second capacitance;
   a third RC integrator having an input and an output and configured to emulate a third capacitance, wherein the output of the third RC integrator is coupled to the input of the summing amplifier;
   a fourth RC integrator having an input and an output and configured to emulate an inductance, wherein the input of the fourth RC integrator is coupled to the outputs of the first and second RC integrators and the output of the fourth RC integrator is coupled to the inputs of the first and second RC integrators; and
   a selectable input stage having a first state and a second state, wherein in the first state the input stage is configured to provide a DC-coupled non-capacitive input to at least one RC integrator and in the second state the input stage is configured to provide an AC-coupled capacitive input to at least two RC integrators.

2. The filter of claim 1, wherein the input stage is coupled to the input of the fourth RC integrator and the input of the summing amplifier during the first state.

3. The filter of claim 1, wherein the input stage is coupled to the input of the first RC integrator during the second state.

4. The filter of claim 1, wherein the damping coefficient of at least one of the first, second, or third RC integrators is controlled to reduce DC instability in the filter.

5. The filter of claim 4, wherein the damping coefficients of any of the RC integrators is controlled by selectively switching in a damping resistor in the respective RC integrator.

6. An analog front end (AFE) comprising:
   a high-pass receive filter for a communication system, the filter comprising:
      a plurality of RC integrators, wherein at least one of the plurality of RC integrators comprises:
         a damping resistor in parallel with a feedback capacitor; and
         a switch for enabling the damping resistor, such that when the damping resistor is enabled, the at least one RC integrator is damped so as to reduce DC instability;
   an AC-coupled capacitive input electronically coupled to the inputs of at least one of the plurality of RC integrators; and
   a summing amplifier electrically coupled to the plurality of RC integrators.

7. The AFE of claim 6, further comprising:
   means for controlling the switch of the at least one RC integrator.

8. The AFE of claim 6, further comprising:

means for programmably configuring the RC integrators to provide effective damping so as to reduce DC instability.

9. A DSL interface card comprising:

an active high-pass filter located in an AFE of the DSL interface card, the filter comprising:
- a summing amplifier having an input and an output, wherein the output of the summing amplifier provides the output of the filter;
- a first RC integrator having an input and an output and configured to emulate a first capacitance, wherein the output of the first RC integrator is coupled to the input of the summing amplifier;
- a second RC integrator having an input and an output and configured to emulate a second capacitance;
- a third RC integrator having an output and configured to emulate a third capacitance, wherein the output of the third RC integrator is coupled to the input of the summing amplifier;
- a fourth RC integrator having an input and an output and configured to emulate an inductance, wherein the input of the fourth RC integrator is coupled to the outputs of the first and second RC integrators and the output of the fourth RC integrator is coupled to the inputs of the first and second RC integrators; and
- a capacitive AC-coupled input stage coupled to an input of at least two of the RC integrators.

10. The DSL interface card of claim 9, wherein the input stage of the filter is coupled to the input of the first RC integrator.

11. The DSL interface card of claim 9, wherein each of the first and second RC integrators comprise:

a damping resistor configured to reduce the DC gain of the respective integrators such a DC offset passing through the integrators is reduced.

12. The DSL interface card of claim 11, wherein each of the first and second RC integrators further comprise:

a switch configured to enable the damping resistor so as to control the effect of the damping resistor on the respective integrators.

13. The DSL interface card of claim 12, further comprising:

a control system configured to control the switches of the first and second integrators.

14. An active high-pass filter comprising:
- a summing amplifier having an input and an output, wherein the output of the summing amplifier provides the output of the filter;
- an inductive RC integrator configured to emulate an inductor;
- a plurality of capacitive RC integrators configured to emulate capacitors of various capacitances, wherein each of the RC integrators has an input coupled to an output of the summing amplifier and each of the plurality of RC integrators has an output that is selectively coupled to an input of the summing amplifier and to an input of the inductive RC integrator so as to produce a desired transfer function; and
- wherein the damping coefficients of the plurality of capacitive RC integrators are selectively controlled to reduce DC instability in the filter.

15. The filter of claim 14, further comprising:

a selectable input stage having a first state and a second state, wherein in the first state the input stage is configured to provide a DC-coupled non-capacitive input and in the second state the input stage is configured to provide an AC-coupled capacitive input.

* * * * *